United States Patent
Boyko et al.

(10) Patent No.: US 7,813,093 B2
(45) Date of Patent: Oct. 12, 2010

(54) OUTPUT DRIVER WITH OVERVOLTAGE PROTECTION

(75) Inventors: Daniel T. Boyko, Norwood, MA (US); Stuart R. Patterson, East Walpole, MA (US)

(73) Assignee: Analog Devices, Inc., Norwood, MA (US)

( * ) Notice: Subject to any disclaimer, the term of this patent is extended or adjusted under 35 U.S.C. 154(b) by 187 days.

(21) Appl. No.: 12/070,224

(22) Filed: Feb. 15, 2008

(65) Prior Publication Data
US 2009/0207544 A1 Aug. 20, 2009

(51) Int. Cl.
H02H 3/20 (2006.01)
(52) U.S. Cl. ........................ 361/91.1; 361/90
(58) Field of Classification Search .................. 361/82, 361/86, 88, 90, 91.1, 91.2, 91.5, 111; 327/108, 327/109, 111, 112; 326/82, 83, 86, 87
See application file for complete search history.

(56) References Cited

U.S. PATENT DOCUMENTS

| | | | |
|---|---|---|---|
| 4,453,092 A | 6/1984 | Joseph | |
| 5,019,720 A | 5/1991 | Skoog et al. | |
| 6,225,867 B1 | 5/2001 | Ilowski et al. | |
| 6,784,624 B2 | 8/2004 | Buonocunto | |
| 6,842,320 B1 * | 1/2005 | Mathur et al. | ............... 361/91.1 |
| 6,919,696 B2 | 7/2005 | Van Casteren | |
| 7,190,191 B1 * | 3/2007 | Mathur et al. | .................. 326/68 |
| 2005/0099748 A1 * | 5/2005 | Aemireddy | ................... 361/82 |

FOREIGN PATENT DOCUMENTS

EP 0 454 091 10/1991

OTHER PUBLICATIONS

Chow, Hwang-Cherng et al., *A Reliable and High Voltage Compatible CMOS I/O Buffer*, The 47th IEEE International Midwest Symposium on Circuits and Systems, 2004, pp. III-451-III-454.
Mandal, Debashis et al., *High Voltage Tolerant Output Buffer Design for Mixed Voltage Interfaces*, Alliance Semiconductor (I) Pvt. Ltd (ALSC), 2005 IEEE, pp. 4277-4280.
Annema, Anne-Johan et al., *5.5-V I/O in a 2.5-V 0.25-μm CMOS Technology*, IEEE Journal of Solid State Circuits, vol. 36, No. 3, Mar. 2001, pp. 528-538.
Search Report and Written Opinion dated May 28, 2009 from International Application No. PCT/US2009/000881.
Office Action cited in connection with U.S. Appl. No. 12/070,280, mailed Jul. 2, 2010, 9 pages.

* cited by examiner

*Primary Examiner*—Stephen W Jackson
*Assistant Examiner*—Terrence R Willoughby
(74) *Attorney, Agent, or Firm*—Goodwin Procter LLP

(57) ABSTRACT

An output driver in an integrated circuit includes a driver circuit operable by a power supply voltage and coupled to an output pad, and a driver power conditioner configured to generate a fractional pad voltage in response to a voltage on the output pad and to provide the fractional pad voltage to at least one transistor of the driver circuit as a protected supply voltage in response to an absence of the power supply voltage.

19 Claims, 7 Drawing Sheets

OUTPUT DRIVER WITH OVERVOLTAGE PROTECTION

FIELD OF THE INVENTION

This invention relates to protection of integrated circuits against electrical overstress applied to external pads and, more particularly, to output drivers with overvoltage protection and methods for overvoltage protection of output drivers.

BACKGROUND OF THE INVENTION

Current VLSI (very large scale integrated circuit) chips implemented with submicron process technology have extremely small geometries and operate at low power supply voltages, such as 3 volts or less. Such VLSI chips are susceptible to electrical overstress applied to an external pad of the chip. For example, a voltage in excess of the rated voltage of transistors connected to an external pad may cause those transistors to fail. The electrical overstress can be applied to the chip at any point during its life, such as during testing or use. However, some configurations are more susceptible to electrical overstress than others. For example, chips connected to external devices or connectors are particularly susceptible to inadvertent application of an overvoltage. One specific example is a USB (universal serial bidirectional) communication port, which is in common usage on computer equipment.

Circuits are known that protect output drivers against overvoltage in the case where the power supply voltage is turned on. However, such circuits do not protect the output driver in cases where the power supply voltage is turned off, is at a low voltage, is open circuited or is connected to ground. Nonetheless, it is desirable to provide overvoltage protection under these conditions in order to prevent inadvertent damage to such circuits. The overvoltage may occur at any time and is not limited to periods when the power supply voltage is turned on. For example, some manufacturers may require the USB port to withstand an overvoltage of 5.25 volts, regardless of whether the power supply voltage is on or off.

Accordingly, there is a need for improved methods and apparatus for overvoltage protection of output drivers in integrated circuits.

SUMMARY OF THE INVENTION

According to a first aspect of the invention, an output driver is provided in an integrated circuit. The output driver comprises a driver circuit operable by a power supply voltage and coupled to an output pad, and a driver power conditioner configured to generate a fractional pad voltage in response to a voltage on the output pad and to provide the fractional pad voltage to at least one transistor of the driver circuit as a protected supply voltage in response to an absence of the power supply voltage.

According to a second aspect of the invention, a method is provided for overvoltage protection of a driver circuit in an integrated circuit. The driver circuit is operable by a power supply voltage and is coupled to an output pad. The method comprises generating a fractional pad voltage in response to a voltage on the output pad, detecting an absence of the power supply voltage, and applying the fractional pad supply voltage to at least one transistor of the driver circuit as a protected supply voltage in the absence of the power supply voltage.

According to a third aspect of the invention, a method is provided for overvoltage protection of a circuit in an integrated circuit. The circuit is operable by a power supply voltage and is coupled to an output pad. The method comprises generating a protected voltage in response to a voltage on the output pad; and applying the protected voltage to at least one transistor of the circuit in the absence of the power supply voltage.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
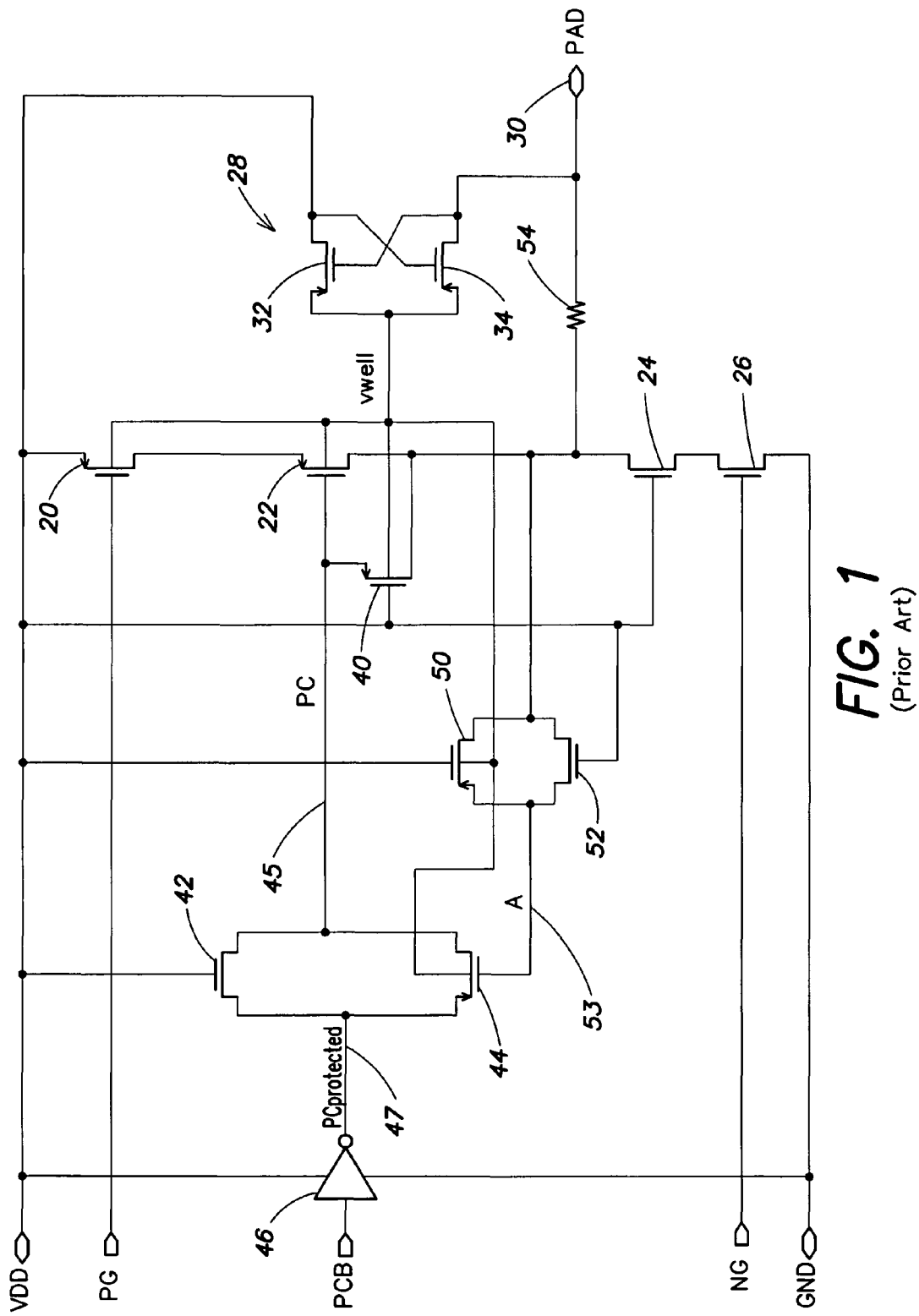
FIG. 1 is a schematic diagram of a prior art output driver.

A schematic diagram of a prior art output driver circuit is shown in FIG. 1. The output driver is considered to be overvoltage tolerant if the power supply voltage VDD is present. PMOS transistors 20 and 22 and NMOS transistors 24 and 26 are coupled in series between the supply voltage VDD and ground and form the basic output driver. The node connecting transistors 22 and 24 is coupled through a resistor 54 to an output pad 30. The connection of the gate of transistor 24 to supply voltage VDD protects both transistors 24 and 26 from process overvoltage. A mux (multiplexer) 28 including PMOS transistors 32 and 34 prevents activating parasitic diodes to supply voltage VDD in the event of overvoltage. A PMOS transistor 40 forces node PC to track output pad 30 in the event of pad overvoltage greater than supply voltage VDD, thus protecting transistors 20 and 22, and also cutting off any current path from output pad 30 to supply voltage VDD. A transmission gate formed by NMOS transistor 42 and PMOS transistor 44 protects any device driving node 45, in this example inverter 46, by limiting node 47 to supply voltage VDD. A transmission gate formed by PMOS transistor 50 and NMOS transistor 52 forces node 53 to track the output pad 30. In some cases, transistors 50 and 52 may be omitted and the gate of transistor 44 may be connected directly to output pad 30. Resistor 54 may not be utilized in some cases.

When the driver circuit of FIG. 1 is operating with supply voltage VDD at 3 volts and the output pad 30 is subjected to a voltage of up to 5.25 volts, no transistor is subjected to an overvoltage. However, if supply voltage VDD is shorted to ground and the output pad 30 is subjected to a voltage up to 5.25 volts, it can be shown that transistors 24, 42, 52, 40, 32, 34, 50, 22, and 44 are subjected to electrical overstress. Accordingly, there is a need for improved driver circuits.

Figure 2:
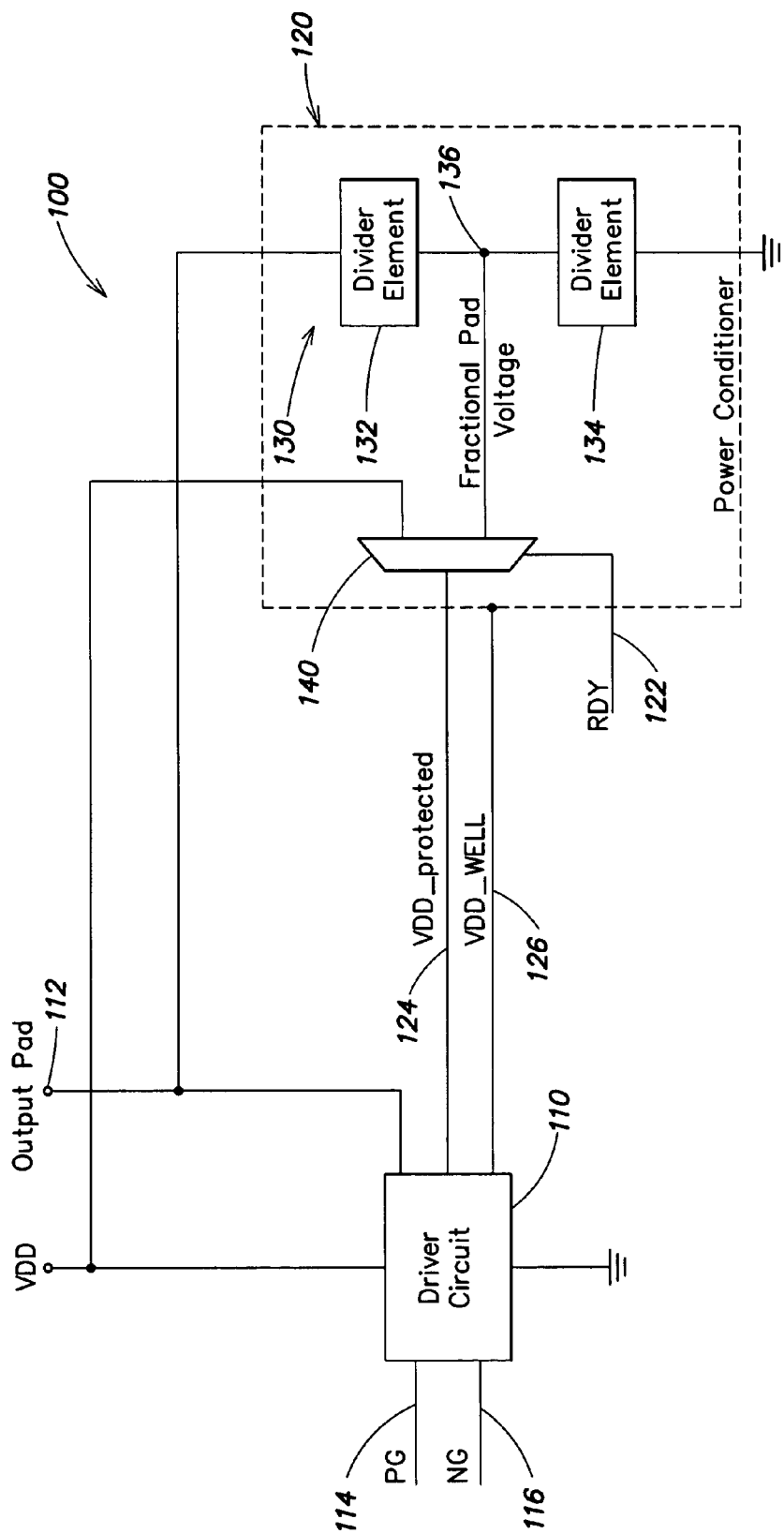
FIG. 2 is a schematic block diagram of an output driver in accordance with an embodiment of the invention.

A block diagram of an output driver 100 in accordance with an embodiment of the invention is shown in FIG. 2. The output driver 100 includes a driver circuit 110 having signal inputs 114 and 116, and a signal output connected to an output pad 112. Driver circuit 110 is connected to a power supply voltage VDD and to ground. Output driver 100 further includes a driver power conditioner 120 that provides protection against electrical overstress as described below. Power conditioner 120 is connected to power supply voltage VDD and ground, and to output pad 112. In addition, power conditioner 120 receives a ready signal 122 which indicates the presence of power supply voltage VDD. Power conditioner 120 provides a protected supply voltage 124 to driver circuit 110 and may also supply a protected well voltage 126 to driver circuit 110.

Power conditioner 120 may include a voltage divider 130 coupled between output pad 112 and ground. Voltage divider 130 includes a first divider element 132 and a second divider element 134 connected in series. A node 136 connects first divider element 132 and second divider element 134. When a voltage is present on output pad 112, a fractional pad voltage is present on node 136. The magnitude of the fractional pad voltage is a function of the voltage on output pad 112 and the divider ratio of divider elements 132 and 134. In some embodiments, the fractional pad voltage is about one-half of the voltage on output pad 112. However, the invention is not limited in this respect. The divider ratio of voltage divider 130 is selected to produce a fractional pad voltage that protects the transistors in driver circuit 110, for a given maximum voltage on output pad 112.

Power conditioner 120 further includes a multiplexer 140 having a first input that receives supply voltage VDD and a second input that receives the fractional pad voltage from voltage divider 130. Multiplexer 140 includes a control input that receives the ready signal 122 and an output that supplies the protected supply voltage 124 to driver circuit 110. When the ready signal 122 indicates that the supply voltage VDD is present, multiplexer 140 provides supply voltage VDD as the protected supply voltage. When the ready signal 122 indicates that the power supply voltage VDD is not present, multiplexer 140 provides the fractional pad voltage as the protected supply voltage. It will be understood that a nonzero fractional pad voltage is present only in the case of a voltage on output pad 112. The protected supply voltage 124 protects driver circuit 110 from damage due to electrical overstress as described below.

Figure 2A:
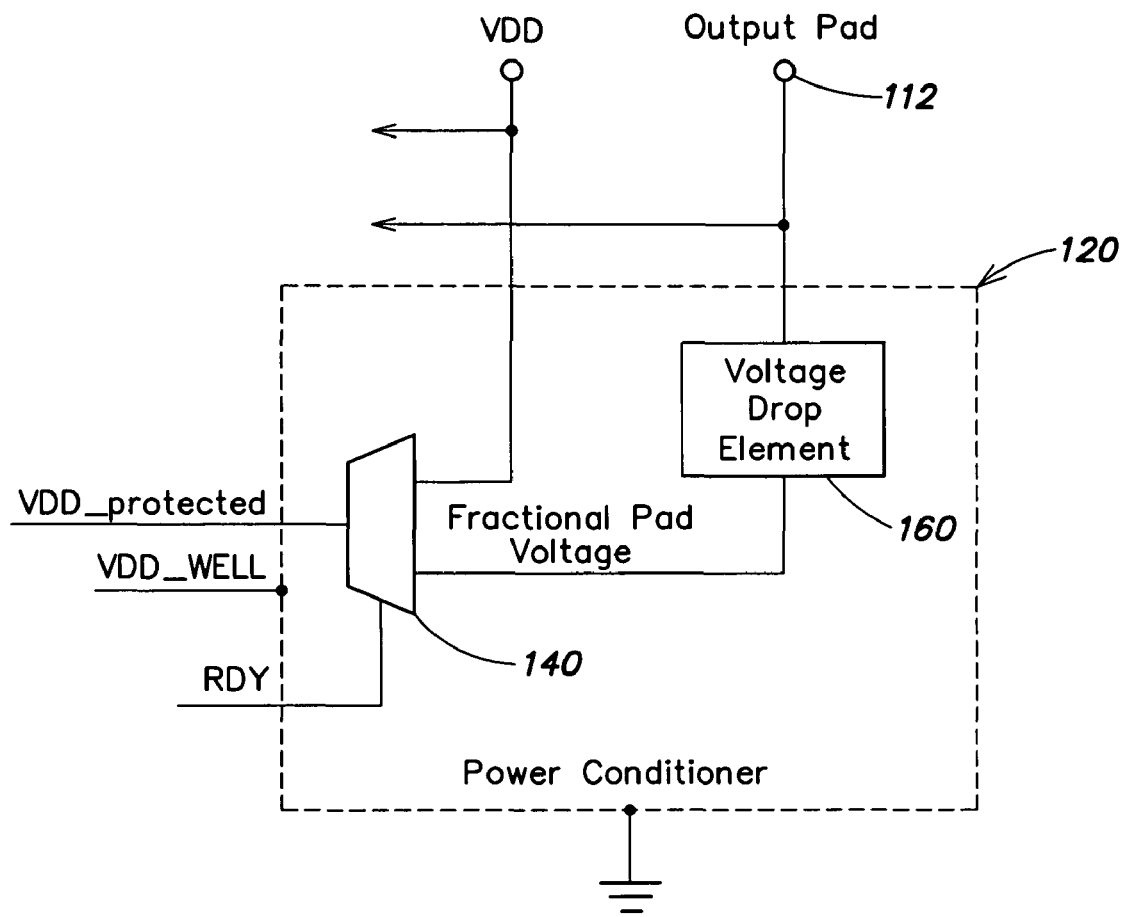
FIG. 2A is a schematic block diagram of a power conditioner in accordance with another embodiment of the invention.

A block diagram of power conditioner 120 in accordance with another embodiment of the invention is shown in FIG. 2A. As in FIG. 2, power conditioner 120 is connected to power supply voltage VDD and ground, and to output pad 112. In addition, power conditioner 120 receives ready signal 122 and provides protected supply voltage 124 and may also supply protected well voltage 126 to driver circuit 110 (FIG. 2). Multiplexer 140 includes a first input that receives supply voltage VDD and a second input that receives the fractional pad voltage.

In the embodiment of FIG. 2A, power conditioner 120 includes a voltage drop element 160 coupled between output pad 112 and the second input of multiplexer 140. The voltage drop element 160 produces a voltage drop which causes the fractional pad voltage to be a fraction of the voltage on output pad 112. In some embodiments, the fractional pad voltage is about one-half of the voltage on output pad 112. However, the invention is not limited in this respect. By way of example, the voltage drop element 160 can be a diode, two or more diodes connected in series, a resistor, a battery, or a combination of these elements. In each case, the voltage drop element 160 is selected such that the difference between a specified maximum voltage on output pad 112 and the fractional pad voltage does not overstress transistors in the driver circuit.

Figure 3:
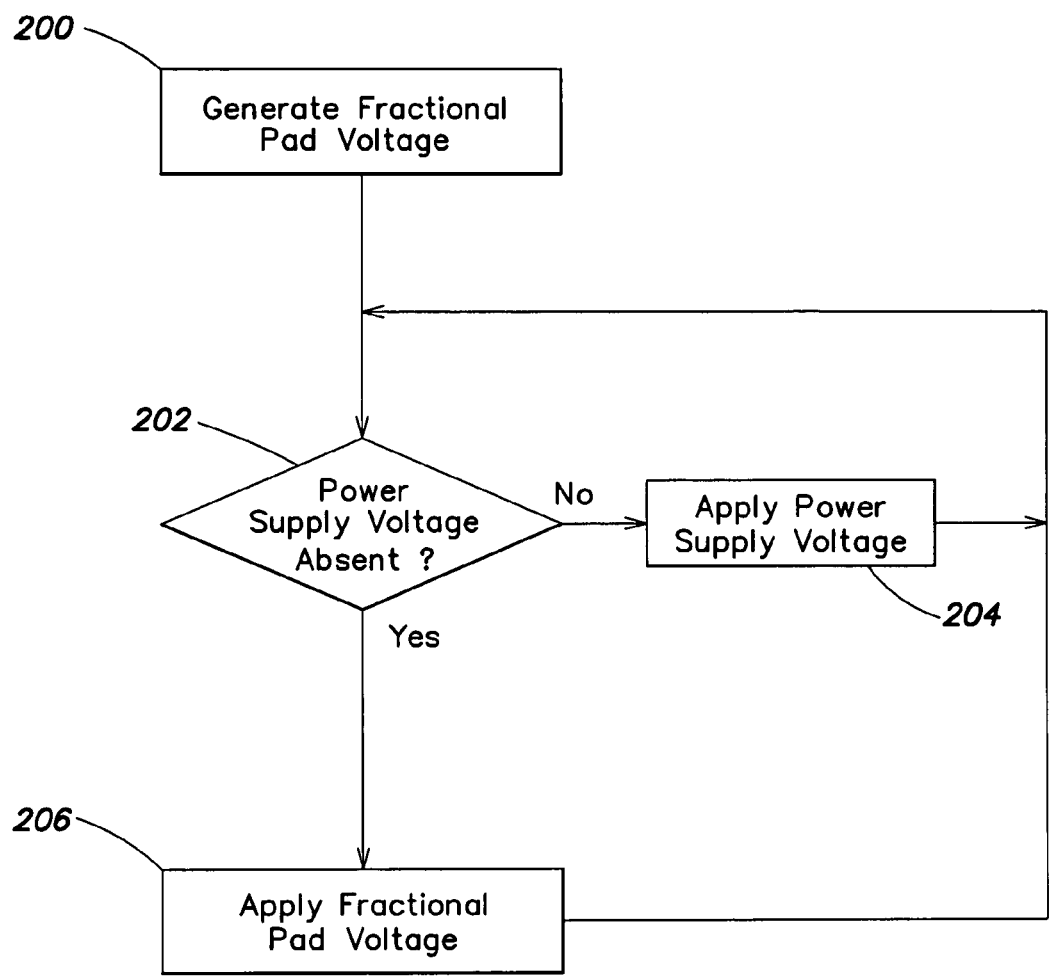
FIG. 3 is a flow chart that illustrates operation of the power conditioner of FIG. 2 in accordance with an embodiment of the invention.

A flow chart of operations performed by power conditioner 120 is shown in FIG. 3. In act 200, the fractional pad voltage is generated by voltage divider 130 in response to a voltage on output pad 112. As indicated above, the divider ratio of voltage divider 130 is selected to avoid damage to the transistors in driver circuit 110 for a given voltage on output pad 112. In act 202, a determination is made as to whether the power supply voltage VDD is absent. This determination may be made from the state of the ready signal 122. If the power supply voltage is not absent (is present), the power supply voltage is applied to the driver circuit 110 in act 204. If a determination is made in act 202 that the power supply voltage is absent, the fractional pad voltage is applied to driver circuit 110 in act 206. It will be understood that the fractional pad voltage is non-zero only when the voltage on output pad 112 is non-zero. The power conditioner 120 continuously monitors the state of the power supply voltage in this manner.

Figure 4A:
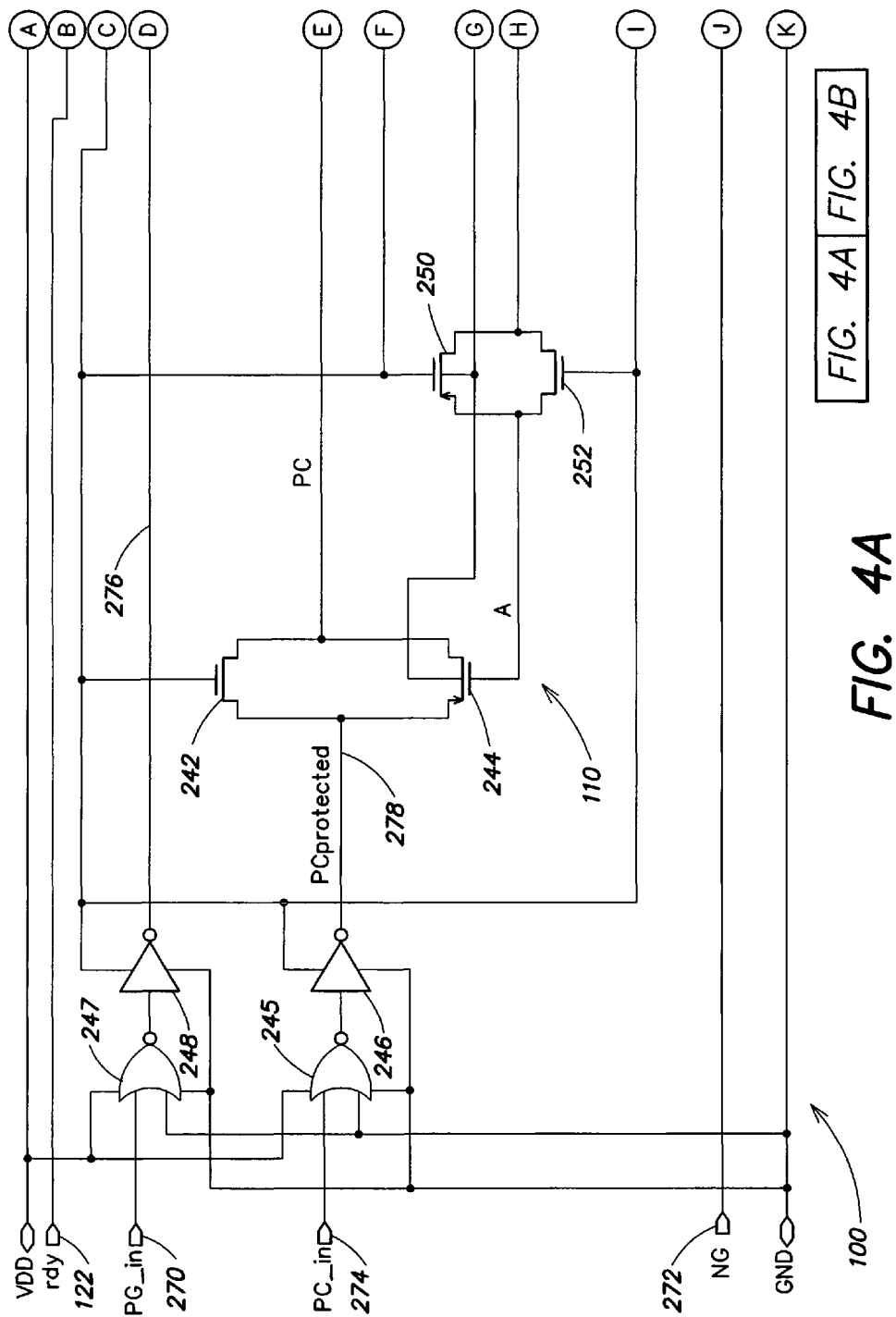
FIGS. 4A and 4B is a schematic diagram of an implementation of the output driver in accordance with an embodiment of the invention.
Figure 4B:
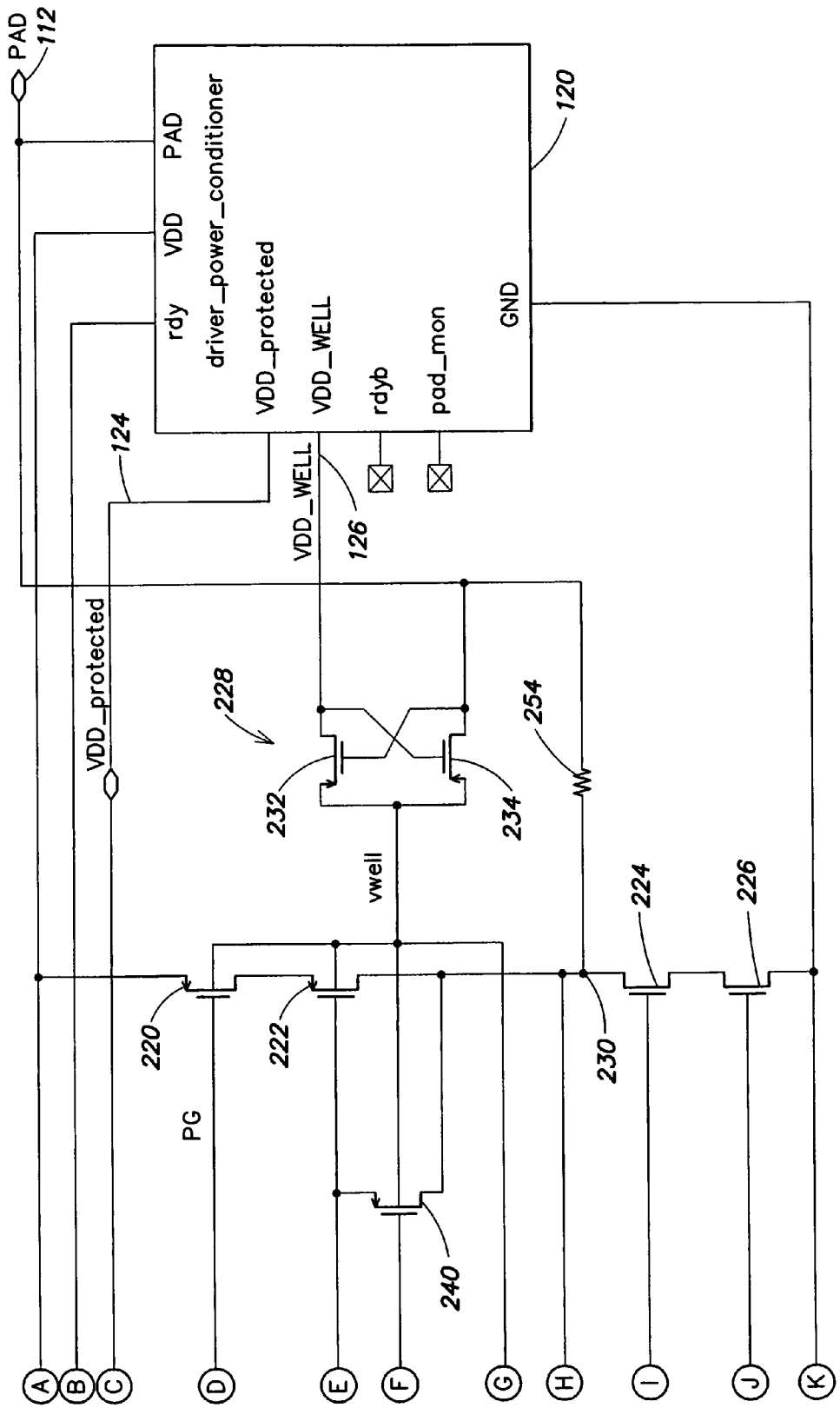

A schematic diagram of an implementation of the output driver 100 in accordance with an embodiment of the invention is shown in FIGS. 4A and 4B. The implementation of output driver 100 includes driver circuit 110 and power conditioner 120. In driver circuit 110, PMOS transistors 220 and 222 and NMOS transistors 224 and 226 are coupled in series between the supply voltage VDD and ground and form the basic output driver. A node 230 connecting transistors 222 and 224 is coupled through a resistor 254 to output pad 112. Driver circuit 110 receives the protected supply voltage 124 from power conditioner 120. The gates of PMOS transistors 240 and 250 and NMOS transistors 242, 252 and 224 are connected to the protected supply voltage. Driver circuit 110 also receives protected well voltage 126 from power conditioner 120.

A mux 228 includes PMOS transistors 232 and 234. Transistor 232 receives protected well voltage 126 and transistor 234 is coupled to output pad 112. The output of mux 228 is coupled to the wells of PMOS transistors 220, 222, 240, 244 and 250.

When supply voltage VDD is present and the pad voltage is less than VDD, the mux 228 provides supply voltage VDD to the back gate of transistors 220 and 222. If the pad voltage were to exceed VDD, a large current can pass through the parasitic diode of transistors 220 and 222 to the supply voltage VDD. The mux 228 applies the maximum of VDD or the pad voltage to the well of transistors 220 and 222. When supply voltage VDD is absent, the pad voltage can exceed the maximum operating voltage of transistors 232 and 234. By applying the protected well voltage 126 to transistors 232 and 234, this problem is avoided.

Input signals to driver circuit 110 include a P signal 270, an N signal 272 and a P control signal 274. The P signal 270 is coupled through logic gates 247 and 248 to node 276 and the gate of PMOS transistor 220. The P control signal 274 is coupled through logic gates 245 and 246 to node 278 and to transistors 242 and 244. The N signal 272 is coupled to the gate of NMOS transistor 226. In other embodiments, an N control signal can be coupled through two logic gates to the gate of NMOS transistor 224. In these other embodiments, the final logic gate driving NMOS transistor 224 is powered by the protected supply voltage 124. Logic gates 246 and 248 are powered by the protected supply voltage 124, whereas logic gates 245 and 247 are powered by supply voltage VDD.

Figure 5:
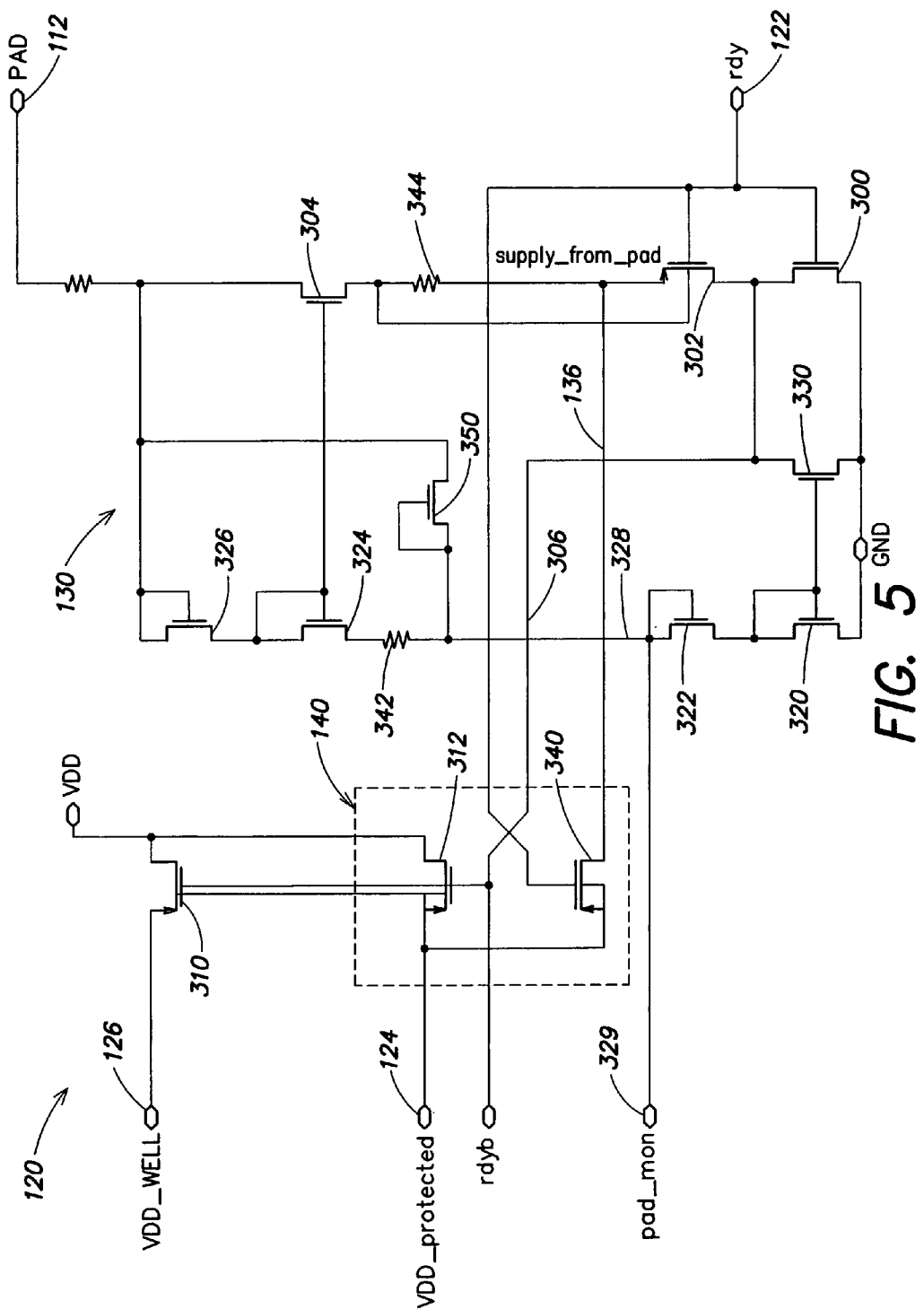
FIG. 5 is a schematic diagram of the power conditioner of FIG. 4 in accordance with an embodiment of the invention.

A schematic diagram of an implementation of power conditioner 120 is shown in FIG. 5. The power conditioner 120 generates the protected supply voltage 124 and the protected well voltage 126 based on the status of the power supply voltage VDD and the voltage on output pad 112. The ready signal 122 tracks supply voltage VDD by direct connection to supply voltage VDD, by connection to a delayed version of supply voltage VDD, or by connection to a fractional version of supply voltage VDD.

If supply voltage VDD is present, ready signal 122 is high and node 306 (RDYB) is pulled low by NMOS transistor 300. PMOS transistor 302 isolates node 306 from node 136 and disables current through NMOS transistor 304. Under these conditions, the voltage on node 136 is near supply voltage VDD. This prevents high frequency signals on output pad 112 from being coupled through transistor 340 to the protected supply voltage 124 during operation. When node 306 is low, transistor 312 turns on and supply voltage VDD passes through transistor 312 to provide protected supply voltage 124. In addition, when node 306 is low, transistor 310 turns on and supply voltage VDD passes through transistor 310 to provide protected well voltage 126.

Diode-connected NMOS transistors 320, 322, 324 and 326, and resistor 342 act as a voltage divider, with no device subjected to electrical overstress. A node 328 connected to transistor 322 and resistor 342 provides a divided pad voltage 329. Transistors 320, 322, 324 and 326 pass a small current that is not substantial until the voltage on output pad 112 reaches the process voltage limits. An NMOS transistor 330 mirrors this low current and, in conjunction with NMOS transistor 304, sets up the fractional pad voltage on node 136 to be approximately one-half of the voltage on output pad 112. Current mirror transistor 330 passes a current through transistor 302. With the ready signal 122 at a low level, the current through transistor 302 establishes a gate-source voltage Vgs on transistor 302. The current through transistors 330 and 302 also flows through transistor 304 and resistor 344. The currents in transistors 304 and 324 are therefore matched. In this embodiment, the current ratio is 1.0, but the ratio can be different. Thus, the gate-source voltage across transistor 304 is the same as the gate-source voltage across transistor 324, and the voltages on nodes 136 and 328 are approximately equal. If output pad 112 rises to 5.2 volts, the fractional pad voltage on node 136 rises to about 2.6 volts.

If supply voltage VDD is not present, ready signal 122 is low and node 306 is high. The gate of transistor 340 receives the low level ready signal 122, and the fractional pad voltage passes through transistor 340 to provide the protected supply voltage 124. The gate of transistor 312 receives the high level on node 306 and is turned off.

PMOS transistors 310, 312 and 340 share a common well which is connected to the protected supply voltage 124. In the case where supply voltage VDD is not present, transistor 310 is turned off by the high level on node 306. As a result, the protected supply voltage 124 is coupled via the well and the parasitic diode of transistor 310 to the protected well voltage 126 at high impedance. Thus, the protected supply voltage 124 and the protected well voltage 126 are both at about one half the output pad voltage when supply voltage VDD is not present. In other embodiments, a separate protected well voltage is not utilized and the protected supply voltage 124 is coupled to wells of those transistors in driver circuit 110 requiring protection.

If desired, resistors 342 and 344 may be selected to drop additional voltage. In other embodiments, resistors 342 and 344 may be replaced by alternate devices for additional voltage drop, or may be omitted. NMOS transistor 350 is used to quickly discharge the voltage divider if output pad 112 is driven low quickly. Transistor 350 is not necessary for operation of the circuit, but is useful in some applications.

The protected supply voltage 124 is applied to gates of transistors in driver circuit 110 that otherwise would be overstressed by the presence of a voltage on output pad 112, when power supply VDD is not present. Consider NMOS driver transistor 224 in FIGS. 4A and 4B and assume a maximum voltage rating of 3.3 volts. If a voltage of 5.2 volts is applied to output pad 112 and the gate of transistor 224 is at ground due to supply voltage VDD being off, transistor 224 will be overstressed. However, according to features of the present invention, the protected supply voltage 124 is applied to the gate of transistor 224. The protected supply voltage is the fractional pad voltage under these conditions. The fractional pad voltage is approximately one half the voltage on output pad 112, or about 2.6 volts for a voltage of 5.2 volts on output pad 112. Under these conditions, transistor 224 is subjected to the difference between the voltage on output pad 112 and the protected supply voltage, or about 2.6 volts in the above example. Thus, transistor 224 is not overstressed. A similar analysis can be applied to the other transistors in driver circuit 110. The divider ratio of voltage divider 130 is selected such that the difference between a specified maximum voltage on output pad 112 and the fractional pad voltage does not overstress transistors in the driver circuit.

Having thus described various embodiments of the invention, numerous improvements and modifications will occur to one skilled in the art. Thus, it is not intended that the breadth of the invention be limited to the specific embodiments illustrated and described. Rather, the scope of the invention is to be limited only by the appended claims and their equivalents.

What is claimed is:

1. An output driver in an integrated circuit, comprising:
   a driver circuit operable by a power supply voltage and coupled to an output pad; and
   a driver power conditioner configured to generate a fractional pad voltage in response to a voltage on the output pad and to provide the fractional pad voltage to at least one transistor of the driver circuit as a protected supply voltage in response to an absence of the power supply voltage,
   wherein the driver circuit includes an input conditioning element, wherein the input conditioning element is protected by the protected supply voltage in the absence of the power supply voltage.

2. An output driver as defined in claim 1, wherein the driver power conditioner is configured to provide the power supply voltage as the protected supply voltage in response to the presence of the power supply voltage.

3. An output driver as defined in claim 1, wherein the driver power conditioner is configured to generate a fractional pad voltage such that a difference between a specified maximum voltage on the output pad and the fractional pad voltage does not overstress transistors in the driver circuit.

4. An output driver as defined in claim 1, wherein the driver power conditioner includes a voltage divider circuit to generate the fractional pad voltage from the voltage on the output pad and a switching circuit to supply the fractional pad voltage to the driver circuit in response to an absence of the power supply voltage.

5. An output driver as defined in claim 1, wherein the driver power conditioner includes a voltage drop element to generate the fractional pad voltage from the voltage on the output pad and a switching circuit to supply the fractional pad voltage to the driver circuit in response to an absence of the power supply voltage.

6. An output driver as defined in claim 1, further comprising a voltage drop element to protect transistors of the driver circuit when an overvoltage is applied to the output pad and the power supply voltage is present.

7. An output driver as defined in claim 1, wherein the input conditioning element comprises an input logic element.

8. An output driver as defined in claim 1, wherein the driver power conditioner is configured to provide a protected well voltage to wells of transistors of the driver circuit in the absence of the power supply voltage.

9. An output driver as defined in claim 1, wherein the driver circuit includes one or more transistors to be protected and wherein the protected supply voltage is coupled to one or more terminals of the transistors to be protected.

10. A method for overvoltage protection of a driver circuit in an integrated circuit, the driver circuit operable by a power supply voltage and coupled to an output pad, comprising:
   generating a fractional pad voltage in response to a voltage on the output pad;
   detecting an absence of the power supply voltage; and
   applying the fractional pad voltage to at least one transistor of the driver circuit as a protected supply voltage in response to detecting the absence of the power supply voltage,
   wherein an input conditioning element is coupled to the driver circuit, further comprising applying the protected supply voltage to the input conditioning element in the absence of the power supply voltage.

11. A method as defined in claim 10, further comprising applying the power supply voltage to the output driver circuit as the protected supply voltage in response to detection of the presence of the power supply voltage.

12. A method as defined in claim 11, wherein applying the fractional pad voltage comprises switching from the power supply voltage to the fractional pad voltage in response to detecting the absence of the power supply voltage.

13. A method as defined in claim 10, wherein generating a fractional pad voltage comprises generating a fractional pad voltage such that a difference between a specified maximum voltage on the output pad and the fractional pad voltage does not overstress transistors in the driver circuit.

14. A method as defined in claim 10, further comprising protecting the driver circuit against overvoltage on the output pad in the presence of the power supply voltage utilizing a voltage drop element.

15. A method as defined in claim 10, wherein the input conditioning element comprises an input logic element.

16. A method as defined in claim 10, further comprising applying a protected well voltage to wells of transistors in the driver circuit in the absence of the power supply voltage.

17. A method as defined in claim 10, wherein the driver circuit includes one or more transistors to be protected and wherein the fractional pad voltage is applied to one or more terminals of the transistors to be protected.

18. A method as defined in claim 10, wherein generating a fractional pad voltage comprises dividing the voltage on the output pad to provide the fractional pad voltage.

19. A method as defined in claim 10, wherein generating a fractional pad voltage comprises dropping the voltage on the output pad to provide the fractional pad voltage.

* * * * *